United States Patent [19]

Shimbo

[11] Patent Number: 4,980,306
[45] Date of Patent: Dec. 25, 1990

[54] METHOD OF MAKING A CMOS DEVICE WITH TRENCH ISOLATION DEVICE

[75] Inventor: Masafumi Shimbo, Tokyo, Japan

[73] Assignee: Seiko Instruments Inc., Japan

[21] Appl. No.: 265,698

[22] Filed: Nov. 1, 1988

[30] Foreign Application Priority Data

Nov. 11, 1987 [JP] Japan ................... 62-284858

[51] Int. Cl.⁵ .......................................... H01L 21/76
[52] U.S. Cl. .................................... 437/34; 437/38;
437/41; 437/56; 437/57; 437/63; 437/67;
437/91; 437/228
[58] Field of Search ............... 437/34, 38, 41, 56,
437/57, 63, 67, 91, 228; 357/50, 49

[56] References Cited

U.S. PATENT DOCUMENTS

| | | | |
|---|---|---|---|
| 4,412,375 | 7/1983 | Matthews | 437/56 |
| 4,442,591 | 4/1984 | Hakem | 437/56 |
| 4,447,290 | 5/1984 | Matthews | 437/56 |
| 4,470,062 | 9/1984 | Muramatsu | 357/50 |
| 4,645,564 | 2/1987 | Morie et al. | |

Primary Examiner—Brian E. Hearn
Assistant Examiner—T. Thomas
Attorney, Agent, or Firm—Bruce L. Adams; Van C. Wilks

[57] ABSTRACT

A semiconductor device of the complementary metal-insulator semiconductor type is composed of a pair of N-type metal oxide semiconductor transistor formed on a P-type silicon substrate and P-type metal oxide semiconductor transistor formed on an n-type well disposed within the p-type substrate. An isolation tranch is disposed between the pair of adjacent transistors, and has one sidewall bordering the well, another opposed sidewall bordering the substrate, and a bottom wall. A selective epitaxial film of p-type is selectively epitaxially deposited on the sidewalls and bottom wall of the trench. The epitaxial film has a dopant density greater than that of the substrate. An insulation oxide material is filled within the trench so as to effectively isolate the pair of transistors from each other.

4 Claims, 3 Drawing Sheets

METHOD OF MAKING A CMOS DEVICE WITH TRENCH ISOLATION DEVICE

BACKGROUND OF THE INVENTION

1. Field of the Invention

The present invention relates to the structure of complementary metal-insulator semiconductor (hereinafter referred to as "C-MIS") transistors having deep and narrow ditches, that is, so-called trench isolation structure, and to the method of making such type of transistors.

2. Prior Art

The conventional isolation region of complementary metal oxide semiconductor (hereinafter referred to as "CMOS") device is formed generally by selective oxidization of semiconductor substrate surface (i.e. LOCOS). However, the minimum area dimension of the conventional isolation region is limited to such extent as to restrict higher integration density of the integrated circuit. In order to eliminate such limitation, another isolation method utilizing a deep and narrow ditch (trench) has been proposed. However, this method has failed to suppress a leak of electric current between N-type metal oxide semiconductor (hereinafter referred to as "NMOS") transistor and P-type metal oxide semiconductor (hereinafter referred to as "PMOS") transistor. Normally, a field-doped region is formed on the bottom of trench so as to suppress the leak. However, the smaller the width of trench, the smaller the effect of field-doped region. In addition, when trying to form another field-doped region on the inner sidewalls of trench, this causes a fabrication problem. Since the field-doping is normally carried out by ion implantation, it is difficult to implant ions into the inner sidewalls of trench.

SUMMARY OF THE INVENTION

In order to solve the above mentioned problem of prior art, an object of the present invention is to provide a semiconductor device of the C-MIS type formed with an isolation or separation structure of deep and narrow trench having a sufficient isolation function, and to provide the method of easily making such type of the semiconductor devices.

According to the present invention, the isolation structure is such that the bottom and inner sidewalls of trench are formed with a field-doped layer composed of selective epitaxial film doped with impurities. Specifically, the selective epitaxial film is formed by molecule layer epitaxy. CMOS device, as an example, according to the present invention is produced by the following method. An n-well is formed in a part of a p-type substrate, and the substrate formed with the well is covered with a field-insulating film. Thereafter, at least a part of the surface of substrate and well, on which a pair of transistors are to be formed, is exposed so as to form thereon a gate insulating film. Further, a first poly-silicon film and a nitride film are sequentially deposited over the gate insulating film. Then, the three-layer film composed of the nitride film, first poly-silicon film, and field insulating film or gate insulating film is selectively etched along a given pattern of trench so as to form the trench between the substrate and the well. Thereafter, a selective epitaxial film of p-type having a dopant density higher than that of the p-type substrate is selectively formed on the bottom and inner sidewalls of trench. Then the trench is filled with an oxide. The then top nitride film is removed to expose the first poly-silicon film. Thereafter, a second poly-silicon film is deposited on the entire surface of first poly-silicon film. The double-layer of first and second poly-silicon films are selectively etched so as to form gate electrodes of the respective transistors. At the same time, a lead electrode pattern composed of the second poly-silicon film is formed to cross over the trench. Thereafter, the pair of NMOS and PMOS transistors are formed on the substrate and the well, respectively, according to the ordinary fabrication method.

Ions are implanted along a specified direction according to the ordinary ion implantation process. Therefore, it would be desirable to selectively dope impurity only into the bottom of trench, but it would be difficult to concurrently dope impurity into the inner sidewalls of trench. Consequently, the ordinary ion implantation technology could not be used to provide the inventive isolation structure. According to the present invention, the molecule layer epitaxy (hereinafter referred to as "MLE") technology is utilized to form the isolation structure. As described, for example, in Japanese Patent application first publication numbers 34930/1986, 34928/1986 and 34927/1986, and the magazine "Semiconductor World" pages 135-140, (January 1985), the MLE process utilizes the absorption of substance containing an element which constitutes the semiconductor substrate onto a crystal face of the semiconductor substrate. Therefore, a single molecule layer is sequentially deposited on the crystal face without regard to the unevenness of crystal face, and the selective deposition can be advantageously carried out. For this reason, the dopant density and film thickness can be controlled more accurately than the conventional ion implantation technology. The MLE process is most suitable for providing the inventive isolation structure.

BRIEF DESCRIPTION OF THE DRAWINGS

FIG. 3b is a structural sectional view taken along line A—A' of FIG. 3a; and

FIG. 3c is a structural sectional view taken along line B—B' of FIG. 3a.

DETAILED DESCRIPTION OF THE INVENTION

Hereinafter, the present invention will be described in detail in conjunction with the drawings, taking a CMOS device as an example.

Figure 1:
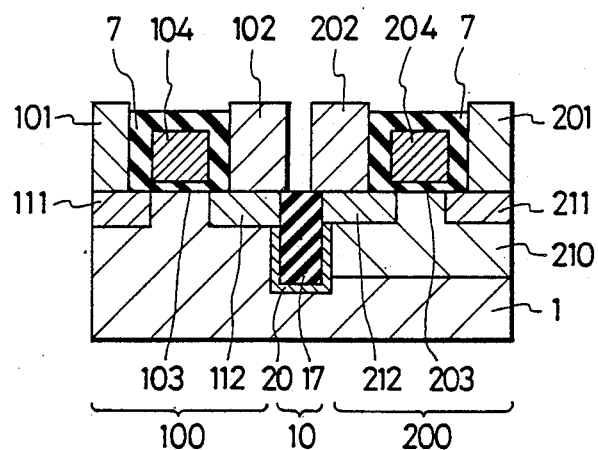
FIG. 1 is a structural sectional view of CMOS device according to the present invention.

FIG. 1 is a structural sectional view of CMOS device according to the present invention. In this embodiment, the CMOS device is comprised of a pair of NMOS transistor 100 and PMOS transistor 200, and an isolation region 10 therebetween. For example, the NMOS transistor 100 is formed on a p-type silicon substrate 1, and the PMOS transistor 200 is formed on an n-well 210. The NMOS transistor 100 is comprised of a gate insulating film 103, a gate electrode 104 disposed on the gate insulating film 103, a source region 111, a drain region 112, a source electrode 101 contacted to the source region 111, and a drain electrode 102 contacted to the drain region 112. The PMOS transistor 200 is comprised of a gate insulating film 203, a gate electrode 204 disposed on the gate insulating film 203, a source region 211, a drain region 212, a source electrode 201 contacted to the source region 211, and a drain electrode 202 contacted to the drain region 212. The isolation region 10 disposed between the NMOS and PMOS transistors has a narrow and deep trench structure ditched between the n-well 210 and the adjacent part of the substrate 1. The trench is formed on its sidewalls and bottom with a p-type selective epitaxial film 20, and is filled with a silicon oxide 17. The selective epitaxial film 20 of p-type has a dopant density higher than that of the p-type substrate 1, and a thickness, which would be determined according to the dopant density and a desired characteristic, of 0.01 μm–0.1 μm when the dopant density is set to $10^{17}/cm^3$–$10^{19}/cm^3$. In this isolation structure, the p-type selective epitaxial film 20 is arranged to connect between the p+-type drain region 212 and the substrate 1. However, the lattice defects in the oxide 17 and on the boundary thereof normally function to increase the threshold voltage of p-channel to thereby reduce the affect of leak current between the drain region 212 and the substrate 1.

Figure 2A:
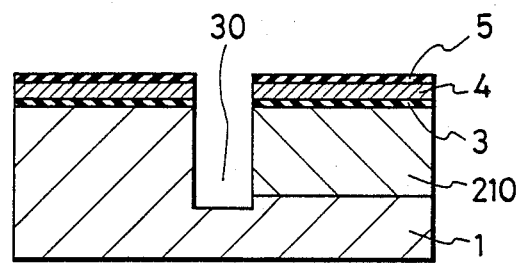
FIGS. 2a-2f are series of sectional views of unfinished CMOS device according to the present invention, illustrating the fabrication process.
Figure 2B:
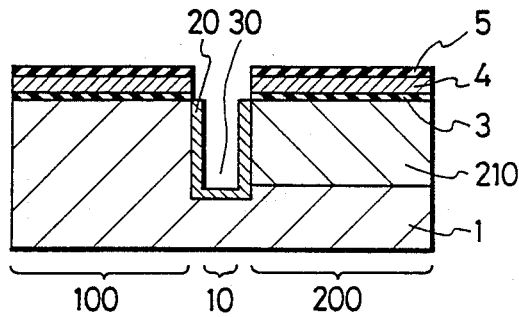
Figure 2C:
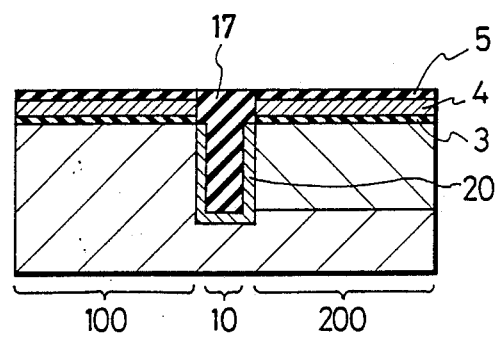
Figure 2D:
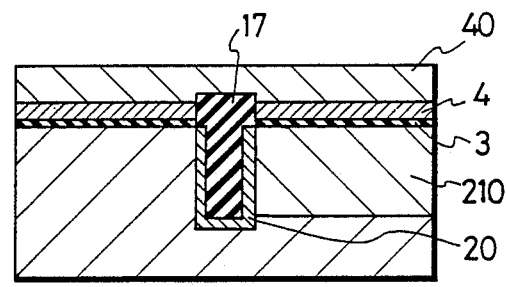
Figure 2E:
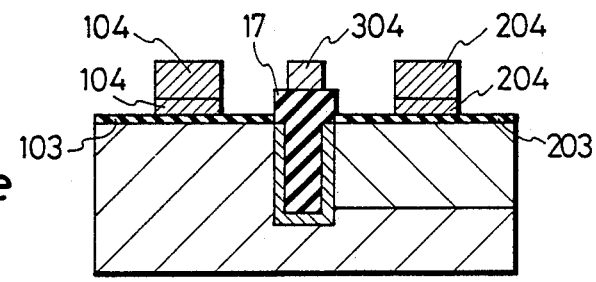
Figure 2F:
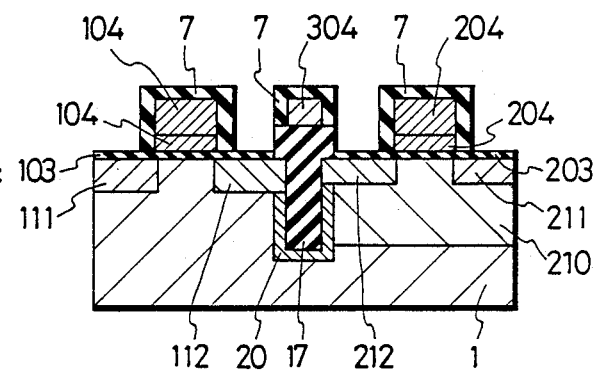

FIGS. 2a–2f show the fabrication steps of the CMOS device according to the present invention. In the step of FIG. 2a, an n-well 210 is locally formed in a p-type silicon substrate 1, and the entire surface of the substrate 1 is exposed. A gate oxide film 3, n+-type poly-silicon film 4 (a first electroconductive film of low resistivity), and a nitride film 5 (a first insulating film) are sequentially accumulated on the substrate surface. The above three-layer film and the substrate 1 are selectively etched along a pattern of isolation region to thereby form a trench 30. The trench 30 is formed by, for example, reactive ion etching (RIE) such that an etched sidewall of the n-well 210 and an opposed etched sidewall of the substrate 1 surround or border the trench 30. In this embodiment, the trench 30 has a depth greater than that of the n-well 210, and, for example, has a depth of 4.0 μ–5.0 μ when the n-well depth is set to 3.0 μ. In the step of FIG. 2b, a p+-type epitaxial film 20 is formed on the exposed sidewalls and bottom of trench 30 by selective MLE process. The p+ epitaxial film 20 is doped with, for example, boron (B) at the density of $10^{17}/cm^3$–$10^{18}/cm^3$, and has a thickness of 10 nm–100 nm. In the step of FIG. 2c, the trench 30 is filled with an oxide film 17 (a second insulating film). The oxide film 17 is formed, for example, by chemically-vapor-depositing an oxide layer on the nitride film 5, and thereafter etching back the oxide layer until the nitride film 5 is exposed. The conventional leveling technology can be applied to this step. In the step of FIG. 2d, the nitride film 5 is removed, and thereafter, a second n+ type poly-silicon film 40 (a second electroconductive film of low resistivity) is deposited on the first n+-type poly-silicon film 4. In the step of FIG. 2e, the double-layer of the n+-type poly-silicon films 4 and 40 is selectively etched to form a gate electrode 104 of an NMOS transistor 100 and another gate electrode 204 of a PMOS transistor 200. At the same time, a poly-silicon lead pattern electrode 304 which crosses over the trench 30 is formed by selectively etching the second n+-type poly-silicon film 40. In the step of FIG. 2f, n+-type source and drain regions 111 and 112 of the NMOS transistor 100 are formed in the substrate 1 and p+-type source and drain regions 211 and 212 of the PMOS transistor 200 are formed in the well 210 by means of, for example, ion implantation process in a similar manner as the conventional process. Thereafter, contact areas and electrodes are formed in the usual manner to complete the CMOS device composed of the pair of NMOS and PMOS transistors 100 and 200.

In the step of FIG. 2a, when the trench is formed by etching of the substrate 1 after the etching 20 of three-layer film of nitride film 5, n+-type poly-silicon film 4 and gate insulating film 3, an etched edge portion of the n+-type poly-silicon film 4 could be covered with an insulating film by oxidization process or CVD process. By this additional step, not only side-etching of the n+-type poly-silicon film 4 can be prevented during the etching of trench, but also the selective p+-type epitaxial film 20 can be prevented from depositing on the edge portion of n+-type poly-silicon film 4.

In this embodiment, the entire surface of substrate is exposed after the n-well 210 is formed in the substrate. In the alternative, a field insulating film can be formed on the substrate surface, if necessary, so as to expose a given portion thereof, and the gate insulating film 3 can be selectively formed on the exposed portion. In such case, the field insulating film or gate insulating film 3 constitutes the bottom layer of the aforementioned three-layer film.

Figure 3A:
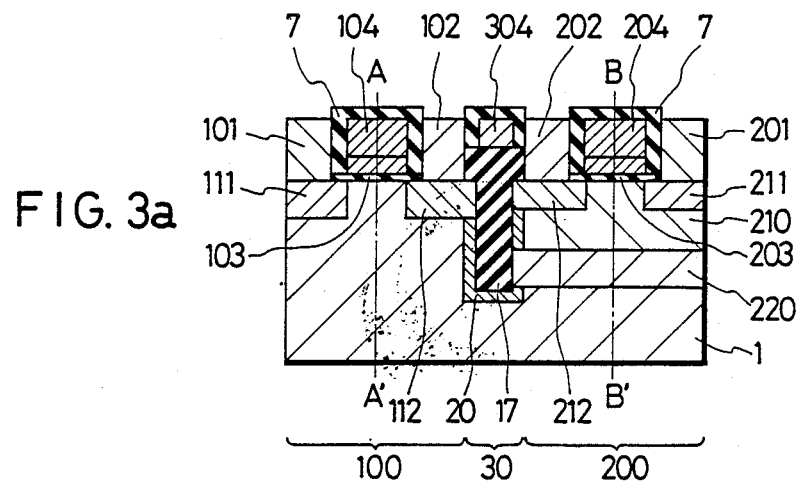
FIG. 3a is a structural sectional view of another embodiment.
Figure 3B:
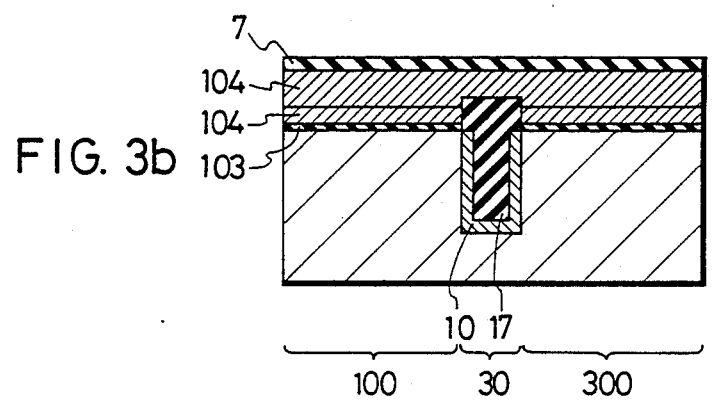
Figure 3C:
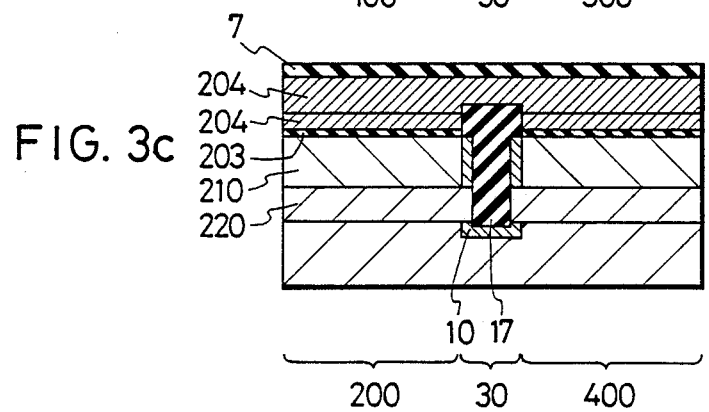

FIGS. 3a–3c show another embodiment of CMOS device according to the present invention. FIGS. 3b and 3c are structural sections taken along lines A—A' and B—B', respectively, of FIG. 3a. This embodiment is characterized in that an n-well 210 of the PMOS transistor 200 has a retrograde structure in which an n+-type region 220 is formed in the deep portion of well 210. The region 220 has a greater dopant density so that the p+-type selective epitaxial film 20 is cut due to diffusion of the dopant from the n+-type region 220. Consequently, NMOS transistor 100 and PMOS transistor 300 are prevented from connecting to each other (FIG. 3b) and NMOS transistor 200 and PMOS transistor 400 are prevented from connecting to each other (FIG. 3c) to thereby easily control the leak current. The retrograde well can be formed by high energy ion implantation or embedment epitaxy. Further, in this embodiment, as shown in FIGS. 3b and 3c, NMOS transistors 100 and 300 are separated from each other as well as PMOS transistors 200 and 400 by trenches which have the same structure as that of the trench separating the pair of NMOS and PMOS transistors from each other.

As described above, according to the present invention, the trench walls are covered with an epitaxial film formed by MLE process so as to increase the withstanding voltage of the isolation region and to reduce the dimension thereof. As a result, an integrated circuit of considerably high integration density can be obtained. In the disclosed embodiment, a single well structure is mainly explained. However, the present invention can be applied to a double well structure and C-MIS device having various types of wells. Further, for the gate electrode material, silicide, metal and others can be used in place of poly-silicon. The inventive isolation structure and method of making the same can be effectively applied to an NMOS integrated circuit and a PMOS integrated circuit as well as the C-MIS device. The MLE process is most preferable for the selective epitaxy, but other process can be utilized. Further, the present invention can be effectively applied to other semiconductor materials such as GaAs than the disclosed silicon.

What is claimed is:

1. A method of making a semiconductor device of the complementary metal-insulator semiconductor type, comprising:

the first step of forming in a semiconductor substrate of one conductive type a well of opposite conductive type and covering the substrate surface with a field-insulating film;

the second step of exposing at least a part of the substrate surface and a part of the well surface, on which a pair of complementary transistors are to be formed, respectively, and thereafter covering these exposed parts with a gate insulating film;

the third step of sequentially depositing a first electroconductive film of low resistivity and a first insulating film on the gate insulating film;

the fourth step of selectively etching a three-layer film composed of the first insulating film, the first electroconductive film, and the gate insulating film or the field-insulating film along a given isolation pattern, and forming a trench according to the isolation pattern between the substrate and the well;

the fifth step of forming a selective epitaxial film of one conductive type having a dopant density greater than that of the substrate on opposed sidewalls and bottom wall of the trench;

the sixth step of filling the trench with a second insulating film and thereafter exposing the first insulating film;

the seventh step of removing the first insulating film to expose the first electroconductive film and depositing a second electroconductive film of low resistivity over the surface of first electroconductive film;

the eighth step of selectively etching a double layer of the first and second electroconductive films to form a pair of gate electrodes for the respective transistors, and at the same time, forming a lead pattern electrode crossing over the trench by the second electroconductive film; and the ninth step of forming source and drain regions of opposite conductive type within the substrate to constitute the first transistor and forming source and drain regions of one conductive type within the well to constitute the second transistor.

2. A method according to claim 1; wherein the fifth step comprises successively epitaxially depositing molecule layers containing dopant of one conductive type.

3. A method according to claim 1; wherein the fourth step includes covering an edge of the first electroconductive film with an insulating film after the selective etching of first electroconductive film 4. A method according to claim 1; wherein the first insulating film is formed of nitride, and the second insulating film is formed of oxide.

* * * * *